United States Patent
Hatakeyama

(10) Patent No.: US 6,680,156 B2
(45) Date of Patent: Jan. 20, 2004

(54) PHOTOSENSITIVE TRANSFER MATERIAL

(75) Inventor: Akira Hatakeyama, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/340,677

(22) Filed: Jan. 13, 2003

(65) Prior Publication Data

US 2003/0170558 A1 Sep. 11, 2003

(30) Foreign Application Priority Data

Jan. 15, 2002 (JP) ........................................ 2002-005939

(51) Int. Cl.⁷ .............................. G03C 1/85; G03C 1/89; G03C 1/805; G03C 11/12
(52) U.S. Cl. ...................... 430/263; 430/258; 430/259; 430/262; 430/263; 430/527
(58) Field of Search ................................ 430/259, 258, 430/262, 263, 256, 527

(56) References Cited

U.S. PATENT DOCUMENTS 5,294,516 A * 3/1994 Sato et al. ................... 430/262
5,409,800 A * 4/1995 Sato et al. ................... 430/263

FOREIGN PATENT DOCUMENTS

JP 11-149008 6/1999

* cited by examiner

Primary Examiner—Richard L. Schilling
(74) Attorney, Agent, or Firm—Sughrue Mion, PLLC

(57) ABSTRACT

A photosensitive transfer material including a temporary support having disposed thereon an alkali-soluble photosensitive resin layer containing a colorant, wherein when the temporary support is peeled from an adjacent layer provided between the temporary support and the photosensitive resin layer at a peeling rate of 1 m/min in an atmosphere of 25° C. and 30% RH, each of the temporary support and the adjacent layer has a surface potential whose absolute value is 5 kV or less after being peeled.

20 Claims, No Drawings

PHOTOSENSITIVE TRANSFER MATERIAL

BACKGROUND OF THE INVENTION

1. Field of the Invention

The present invention relates to a photosensitive transfer material, and particularly to a photosensitive transfer material for preparation of color filters used in color liquid crystal displays.

2. Description of the Related Art

Photosensitive transfer materials for preparation of color filters used in color liquid crystal displays are known. For example, Japanese Patent Application Laid-Open (JP-A) Nos. 5-173820 and 11-149008 disclose examples of photosensitive transfer materials comprising a temporary support having successively disposed thereon a thermoplastic resin layer, an alkali-soluble interlayer and an alkali-soluble photosensitive resin layer containing a pigment. In these inventions, the photosensitive resin layer is usually adhered to a substrate for the photosensitive transfer material by a lamination method, and the temporary support is subsequently peeled off, after which the resultant product is subjected to exposure and development to form an image on the substrate.

This method has a problem in that after the lamination step has been completed and when the temporary support has been peeled off, the temporary support and a surface of a layer from which the temporary support has been peeled (a layer provided by applying a coating directly on the temporary support during manufacturing of the photosensitive transfer material) build up electrostatic charges due to peeling.

The charge voltage varies depending on the environmental temperature, relative humidity and a peeling rate, and hence cannot be simply defined. Occasionally the electrostatic voltage may exceed ±10 kV and thereby cause the following problems. A first problem is that dust is attracted by static electricity, possibly leading to pixel defects. A second problem is that when color filters are formed on thin-film transistors (TFT) aligned on a transparent substrate (Color Filter on Array—CoA mode), the thin-film transistors are broken by electrostatic charge caused by peeling. In recent years, as a rate of manufacturing color filters increases, a peeling rate of the temporary support increases, and therefore, such problems have become more and more significant.

In order to solve these problems, a method has been proposed to provide a static eliminator in a manufacturing line. Even if this method is employed, the voltage of electrostatic charges built up by peeling cannot sufficiently be reduced, and hence, techniques to cope with the problems are demanded.

SUMMARY OF THE INVENTION

An object of the present invention is to provide a photosensitive transfer material that achieves a reduced surface potential on a temporary support as well as on a surface of a layer from which the temporary support has been peeled off when peeling is carried out.

A first aspect of the present invention is a photosensitive transfer material comprising a temporary support having disposed thereon an alkali-soluble photosensitive resin layer containing a colorant, wherein when the temporary support is peeled from a layer provided between the temporary support and the photosensitive resin layer (hereinafter this layer is referred to as an "adjacent layer") at a peeling rate of 1 m/min in an atmosphere of 25° C. and 30% RH, each of the temporary support and the adjacent layer has a surface potential whose absolute value is 5 kV or less after being peeled.

A second aspect of the invention is a photosensitive transfer material comprising a temporary support having disposed thereon an alkali-soluble photosensitive resin layer containing a colorant, wherein when the temporary support is peeled from an adjacent layer provided between the temporary support and the photosensitive resin layer at a peeling rate of 1 m/min in an atmosphere of 25° C. and 30% RH, each of the temporary support and the adjacent layer has a surface resistivity at 25° C. and 30% RH, of $1\times10^{14}\Omega/\square$ or less after being peeled.

A third aspect of the invention is a photosensitive transfer material comprising a temporary support having successively disposed thereon a thermoplastic resin layer, an alkali-soluble interlayer and an alkali-soluble photosensitive resin layer containing a colorant, wherein when the temporary support is peeled from the thermoplastic resin layer at a peeling rate of 1 m/min in an atmosphere of 25° C. and 30% RH, each of the temporary support and an adjacent layer has a surface potential whose absolute value is 5 kV or less after being peeled.

DESCRIPTION OF THE PREFERRED EMBODIMENTS

Photosensitive Transfer Material

A photosensitive transfer material according to the present invention comprises a temporary support having disposed thereon an alkali-soluble photosensitive resin layer containing a colorant and is characterized in that when the temporary support is peeled from an adjacent layer provided between the temporary support and the photosensitive resin layer at a peeling rate of 1 m/min in an atmosphere of 25° C. and 30% RH, each of the temporary support and the adjacent layer has a surface potential whose absolute value is 5 kV or less after being peeled. Incidentally, a face of the temporary support on which the photosensitive resin layer is provided is referred to as a "front surface", and a face opposite thereto is referred to as a "back surface".

It is preferable that each of the temporary support and the adjacent layer has a surface electrical potential whose absolute value is 1 kV or less after being peeled.

It is also preferable that a difference between an amount of electrostatic charge on the front surface of the peeled temporary support when it is brought into contact with polyethylene terephthalate, and an amount of electrostatic charge on the surface of the peeled adjacent layer when it is brought into contact with polyethylene terephthalate is 0.5 nC/cm$^2$ or less.

The photosensitive transfer material according to the invention and a method of manufacturing color filters using the photosensitive transfer material will be described below.

Temporary Support

Conventionally known supports such as polyesters and polystyrenes may be used as the temporary support in the invention. Among these, biaxially oriented polyethylene terephthalate is preferable from the standpoints of cost, heat resistance and dimensional stability. A thickness of the temporary support is preferably about 15 to 200 μm, and more preferably about 30 to 150 μm. If the thickness of the temporary support falls within a range of about 15 to 200 μm, galvanized sheet-like wrinkles caused by heat do not occur during the laminating step, and further there is no disadvantage in terms of cost.

If necessary, the temporary support may be provided with additional coating layers, such as an electrically conductive layer, a charge controlling layer, a releasing layer and a subbing layer, and vapor-deposited layers. Herein, "temporary support" may collectively refer to the "temporary support" and these provided layers.

The releasing layer as used herein refers to a layer which is provided by applying a coating at an outermost portion of the temporary support, in order to lower a peel force between the temporary support and the adjacent layer, which is arranged on the front surface of the temporary support.

The subbing layer as used herein refers to a layer which is provided by applying a coating on the temporary support, for achieving various objects such as slipperiness and scratch resistance.

The electrically conductive layer and the charge controlling layer will be described below. These layers are provided mainly by applying a coating, but occasionally other methods, such as vapor deposition, may be employed.

Adjacent Layer

The adjacent layer as used herein refers to a layer which is provided adjacent to the temporary support. In the photosensitive transfer material according to the invention, after the laminating step, peeling is carried out between the temporary support and the adjacent layer. The adjacent layer is not particularly limited, and it may be a thermoplastic resin layer or a protective layer as described below. In addition to these layers, the photosensitive transfer material may further have an electrically conductive layer. Among these layers, the thermoplastic resin layer is the most preferable adjacent layer.

Method of Reducing the Surface Potential when the Temporary Support is Peeled from the Adjacent Layer The method of reducing the surface potential is divided into the following two methods.

(1) Method of adjusting a tribo series rank of the temporary support to be consistent with that of the adjacent layer:

The first method is to adjust a tribo series rank of the front surface of the temporary support to be consistent with that on the surface of the adjacent layer. The tribo series as used herein means a series in which, based on results of randomly bringing various materials into contact with each other to generate electrostatic charges, the materials are ranked in order from materials with a tendency to be positively electrostatically charged to materials with a tendency to be negatively electrostatically charged. The tribo series is described in, for example, *Electrostatics Handbook*, page 59 (edited by the Institute of Electrostatics Japan, (1981), published by Ohmsha, Ltd.). Specifically, there are two methods of altering a tribo series rank: one is adding a substance capable of altering the tribo series rank to the thermoplastic resin layer or the like, which is the adjacent layer; the other is applying a coating of a substance capable of altering the tribo series rank on the front surface of the temporary support. In the invention, a layer coated with the substance capable of altering the tribo series rank on the front surface of the temporary support is specifically called a "charge controlling layer".

Examples of the substance capable of altering the tribo series rank include methyl cellulose, ethyl cellulose and gelatin, among which gelatin is most preferable.

(2) Method of providing an electrically conductive layer by coating:

The second method comprises providing an electrically conductive layer at any portion of the photosensitive transfer material. The electrically conductive layer as used herein refers to a layer whose arrangement serves to lower a surface resistivity of the temporary support or that of the photosensitive transfer material. The electrically conductive layer is usually a layer containing an organic or inorganic electrically conductive substance. Hereinafter, the organic or inorganic electrically conductive substance is also referred to as an electrically conductive agent. Examples of the organic electrically conductive substance include ionically conductive polymers, such as polyacrylic acid and polyethylene oxide, and electrically conductive polymers, such as polypyrrole and polyaniline. The ionically conductive polymers are described in, for example, *Application and Market of Water Soluble Polymers*, p.285 (edited by Shinji Nagatomo, (1984), published by CMC Publishing Co., Ltd.); and the electrically conductive polymers are described in, for example, *Foundation and Application of Electrically Conductive Polymers* (edited by Masami Yoshino, (1988), published by IPC).

Examples of the inorganic electrically conductive substance include fillers such as carbon, metal fine powders and metal oxide fine powders. These fillers are described in, for example, *Research and Development of Fillers*, p.98 (1990), published by CMC Publishing, Ltd. Preferably, the electrically conductive substance is contained in an amount of 2 to 85% by weight, and more preferably 5 to 75% by weight relative to the electrically conductive layer. The electrically conductive layer produced using tin oxide as described in JP-A No. 11-149008 is particularly preferred.

The electrically conductive layer used in the invention has a surface resistivity, in an atmosphere of 25° C. and 30% RH, of $1\times10^{14}\Omega/\square$ or less, and preferably $1\times10^{13.5}\Omega/\square$ or less.

In the invention, the electrically conductive layer can be provided in an arbitrarily selected portion of the photosensitive transfer material. In the invention, it is possible for the thermoplastic resin layer and the alkali-soluble interlayer to serve as the electrically conductive layer. It is also possible for the photosensitive transfer material to have a layer that only functions as the electrically conductive layer (hereinafter, this layer is also referred to as an "independent electrically conductive layer"). While the electrically conductive layer can be provided in an arbitrarily selected portion of the photosensitive transfer material of the invention, it is preferable that one or more electrically conductive layers are provided on either the front surface or the back surface of the temporary support after peeling, and on one surface of the photosensitive resin layer after peeling.

For example, in preferred embodiments of the present invention, the photosensitive transfer material comprising a temporary support having successively disposed thereon a thermoplastic resin layer, an alkali-soluble interlayer and an alkali-soluble photosensitive resin layer containing a colorant may have the following constructions.

(1) One independent electrically conductive layer is disposed on the back surface of the temporary support with the alkali-soluble interlayer serving as the electrically conductive layer.

(2) One independent electrically conductive layer is disposed on the front surface of the temporary support with the alkali-soluble interlayer serving as the electrically conductive layer.

(3) One independent electrically conductive layer is disposed on the back surface of the temporary support, and another independent electrically conductive layer is disposed between the alkali-soluble interlayer and the photosensitive resin layer, to thereby provide a total of two electrically conductive layers.

(4) One independent electrically conductive layer is disposed on the front surface of the temporary support, and another independent electrically conductive layer is disposed between the alkali-soluble interlayer and the photosensitive resin layer, to thereby provide a total of two electrically conductive layers.

Further, it is also preferable to combine the layer containing the substance capable of altering the tribo series rank or the charge controlling layer, and the electrically conductive layer. Specifically, a preferred embodiment of the photosensitive transfer material according to the invention has a construction in which an additional electrically conductive layer is further arranged on the temporary support, which includes the charge controlling layer, to serve as the independent electrically conductive layer, and/or the thermoplastic resin layer or the interlayer is made to serve as the electrically conductive layer.

Peeling Conditions

Peeling is carried out between the temporary support and the adjacent layer. A peeling rate and a peeling angle are not particularly limited. However, the peeling rate is preferably 0.01 to 15 m/min, and preferably 0.1 to 5 m/min. The peeling angle may be any angle within a range of 0° to 180°.

Alkali Solubility

The term "alkali-soluble" used herein means that the material is soluble in an aqueous solution of an alkaline substance as described below, or in the solution further containing an organic solvent that is miscible with water.

Suitable examples of the alkaline substance include alkali metal hydroxides (such as sodium hydroxide and potassium hydroxide), alkali metal carbonates (such as sodium carbonate and potassium carbonate), alkali metal bicarbonates (such as sodium hydrogencarbonate and potassium hydrogencarbonate), alkali metal silicates (such as sodium silicate and potassium silicate), alkali metal metasilicates (such as sodium metasilicate and potassium metasilicate), triethanolamine, diethanolamine, monoethanolamine, morpholine, tetraalkylammonium hydroxides (such as tetramethylammonium hydroxide), and trisodium phosphate. A preferable concentration of the alkaline substance is from 0.01% to 30% by weight, and a pH thereof is from 8 to 14.

Suitable examples of the organic solvent that is miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, aetone, methyl ethyl ketone, cyclohexanone, $\epsilon$-caprolactone, $\gamma$-butyrolactone, dimethylformamide, dimethylacetamide, hexamethyl-phosphoryl amide, ethyl lactate, methyl lactate, $\epsilon$-caprolactam, and N-methylpyrrolidone. A concentration of the organic solvent that is miscible with water is from 0.1% to 30% by weight. Further, a known surfactant may additionally be added thereto. A concentration of the surfactant is preferably from 0.01% to 10% by weight.

Thermoplastic Resin Layer

Examples of the resin constituting the thermoplastic resin layer of the invention include acrylic resins, polystyrene resins, polyesters, polyurethanes, rubber-based resins, vinyl acetate-based resins, polyolefin-based resins and the copolymers thereof. Though it is not essential that the resin constituting the thermoplastic resin layer of the invention is alkali-soluble, the resin is desirably alkali-soluble.

Specific examples of the resin constituting the thermoplastic resin layer include saponification products of copolymers of ethylene and acrylic ester, saponification products of copolymers of styrene and (meth)acrylic ester, terpolymers of styrene, (meth)acrylic acid and (meth)acrylic ester, saponification products of copolymers of vinyltoluene and (meth)acrylic ester, poly(meth)acrylic esters, saponification products of copolymers of (meth)acrylic ester copolymers of, e.g., butyl (meth)acrylate and vinyl acetate, and organic polymers that are soluble in an alkaline aqueous solution, in the organic polymers described in *Plastics Performance Handbook*, edited by the Japan Plastics Industry Federation and Japan Plastic Model Manufacturing Cooperative Association, published by Kogyo Chosakai Publishing Co., Ltd., published on Oct. 25, 1968.

Preferably, these resins are used as a mixture of two kinds thereof.

That is, these resins can be selected for use from those having a weight average molecular weight of from 50,000 to 500,000 and a glass transition temperature (Tg) ranging from 0 to 140° C. (hereinafter referred to as "resin (A)"), and those preferably having a weight average molecular weight of from 60,000 to 200,000 and a glass transition temperature (Tg) ranging from 30 to 110° C. Specific examples of the resins that are soluble in an alkaline aqueous solution include those described in JP-B Nos. 54-34327, 55-38961, 58-12577 and 54-25957, JP-A No. 61-134756, JP-B No. 59-44615, JP-A Nos. 54-92723, 54-99418, 54-137085, 57-20732, 58-93046, 59-97135 and 60-159743, OLS No. 3,504,254, JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404 and 2-208602, and Japanese Patent Application No. 4-39653. Among these, particularly preferable is methacrylic acid/2-ethylhexyl acrylate/benzyl methacrylate/methyl methacrylate copolymer as described in JP-A No. 63-147159.

Further, the above-described various resins can be selected for use from those having a weight average molecular weight of from 3,000 to 30,000 and a glass transition temperature (Tg) ranging from 30 to 170° C. (hereinafter referred to as "resin (B)"), and those preferably having a weight average molecular weight of from 4,000 to 20,000 and a glass transition temperature (Tg) ranging from 60 to 140° C. Preferable examples include those described in the patents as cited above. Among these, particularly preferable is styrene/(meth)acrylic acid copolymer as describe in JP-B No. 55-38961 and JP-A No. 5-241340.

When the resin (A) constituting the thermoplastic resin layer has a weight average molecular weight of less than 50,000 or a glass transition temperature (Tg) of lower than 0° C., reticulation may occur, or the thermoplastic resin swells out into the surroundings during the transfer, thereby contaminating a permanent support. On the other hand, when the resin (A) has a weight average molecular weight exceeding 500,000 or a glass transition temperature (Tg) higher than 140° C., air bubbles are incorporated between pixels during the transfer, or the removability of the alkaline aqueous solution of the thermoplastic resin are lowered.

The thickness of the thermoplastic resin is preferably 6 $\mu$m or more, due to the fact that when the thickness of the thermoplastic resin is less than 6 $\mu$m, it is impossible to completely absorb irregularities of 1 $\mu$m or more of the under layer. Further, the upper limit of the thickness of the thermoplastic resin is about 100 $\mu$m or less, and preferably about 50 $\mu$m or less from the standpoints of removability properties of the alkaline aqueous solution and manufacturing suitability.

As to a solvent for preparing a coating liquid of the thermoplastic resin layer of the invention, there are no particular limitation so far as it dissolves the resin constituting the thermoplastic resin layer. Useful examples thereof include methyl ethyl ketone, n-propanol and i-propanol.

Alkali-soluble Interlayer

As to a resin constituting the interlayer, there are no particular limitation so far as it is alkali-soluble. Examples of the usable resin include polyvinyl alcohol-based resins, polyvinylpyrrolidone-based resins, cellulosic resins, acrylamide-based resins, polyethylene oxide-based resins, gelatin, vinyl ether-based resins, polyamide resins and the copolymers thereof. Further, there can be used resins prepared by copolymerizing a resin that is usually alkali-insoluble, such as polyesters, with a monomer having a carboxyl group or a sulfonic acid group, thereby making the resin alkali-soluble.

Among these, preferable is polyvinyl alcohol. Polyvinyl alcohol having a saponification value of 80% or more is preferable, and more preferably from 83 to 98%.

The resins constituting the interlayer are preferably used as a mixture of two or more thereof. Particularly, a mixture of polyvinyl alcohol and polyvinylpyrrolidone is preferable for use. A weight ratio of polyvinylpyrrolidone/polyvinyl alcohol is preferably in the range of from 1/99 to 75/25, and more preferably from 10/90 to 50/50. When this weight ratio is less than 1/99, the surface state of the interlayer becomes worse, causing a problem in that the adhesion to the photosensitive resin layer provided on the interlayer becomes poor. On the other hand, when it exceeds 75/25, the oxygen-shielding properties of the interlayer are impaired, leading to lowered sensitivity.

If necessary, additives such as surfactants may be incorporated in the interlayer.

The thickness of the interlayer is preferably in the range of from 0.1 to 5 $\mu$m, and more preferably from 0.5 to 3 $\mu$m. When the thickness of the interlayer falls within a range of from 0.1 to 5 $\mu$m, the oxygen-shielding properties are not impaired, and thus a problem of a prolonged duration for removing the interlayer during the development does not arise.

As the solvent for preparing a coating liquid for the interlayer, there are no particular limitations so far as it dissolves the above-described resin, but preferable is water. A mixture of water and the water-miscible organic solvent as described above is also preferable. Specific examples of the solvent include water, a water/methanol (90/10) mixture, a water/methanol (70/30) mixture, a water/methanol (55/45) mixture, a water/ethanol (70/30) mixture, a water/1-propanol (70/30) mixture, a water/acetone (90/10) mixture and a water/methyl ethyl ketone (95/5) mixture (weight ratio).

Photosensitive Resin Layer

As the resin constituting the photosensitive resin layer of the invention, conventionally known photopolymerizable compositions may be employed. Preferable examples thereof are described in, for example, Japanese Patent Application No. 2-82262. As used herein, the term "resin" covers a monomer or an oligomer that causes polymerization by light exposure to become a resin.

The photosensitive resin layer of the invention may contain a pigment in addition to the resin. Preferred kinds and sizes of the pigment are described in, for example, JP-A No. 11-149008.

If desired, additives such as surfactants may be incorporated in the photosensitive resin layer of the invention. As the solvent for preparing a coating liquid for the photosensitive resin layer of the invention, there are no particular limitations so far as it dissolves the resin constituting this layer. Useful examples include methyl ethyl ketone, n-propanol and i-propanol.

In order to protect the photosensitive resin layer from contamination or damage during the preservation, it is preferred to provide a thin covering sheet on the photosensitive resin layer. Though the covering sheet may be made of a material that is the same as or similar to the temporary support, it should be readily separated from the photosensitive resin layer. Suitable examples of the covering sheet material include silicone paper and a polyolefin or polytetrafluoroethylene sheet. The thickness of the covering sheet is about 5 to 100 $\mu$m. Particularly preferable is a polyethylene or polypropylene film having the thickness of 10 to 30 $\mu$m.

Method for Forming Images

Next, the method for forming images using the photosensitive transfer material according to the invention will be described.

First, the covering sheet of the photosensitive transfer material is removed, and the photosensitive resin layer is laminated with the substrate under sufficient pressure with heating. For the lamination, conventionally known laminators and vacuum laminators can be used. In order to increase the producibility, an auto-cut laminator can also be used. Thereafter, the temporary support is peeled off, and light exposure is carried out through a given photomask, the thermoplastic resin layer and the interlayer, followed by removal. The removal is carried out by known methods such as dipping in a solvent or an aqueous solution for development, especially an alkaline aqueous solution, spraying a processing solution from a sprayer, rubbing by a brush, and processing while irradiating an ultrasonic wave.

After this step is repeated several times using a photosensitive transfer material having photosensitive resin layers colored with different colors, a multi-colored image can be formed.

The photosensitive transfer material according to the invention can be applied for preparation of color filters used in liquid crystal displays and for preparation of protective layers of color filters. Also, the photosensitive transfer material according to the invention is conveniently used for preparation of multi-colored images or print wiring substrates.

In order to produce print wiring substrates, known copper-clad laminated plates are used as the substrate. In order to prepare color filters, conventionally known glass plates and soda glass plates having formed on the surface thereof a silicon oxide film are used as the substrate.

The invention provides an advantage in that when print wiring substrates are produced or color filters are prepared, the temporary support and a surface of a layer from which the temporary support has been peeled off (a layer provided directly on the temporary support in the manufacturing step of the photosensitive transfer material) are not electrostatically charged even if peeling is carried out. Thus, dust is not attracted by static electricity, and the thin-film transistors are not broken. Accordingly, it is possible to stably produce print wiring substrates or prepare color filters even at a high speed.

EXAMPLES

The present invention will be described below in more detail with reference to the following Examples, but it should not be construed that the invention is limited thereto.

Comparative Example (1) Temporary Support

Biaxially oriented polyethylene terephthalate having a thickness of 75 $\mu$m was used as the temporary support.

(2) Thermoplastic Resin Layer

| | |
|---|---:|
| Polymer 1: Copolymer of methyl methacrylate/2-ethylhexyl acrylate/benzyl methacrylate/methacrylic acid (55/30/10/5) (weight average molecular weight: 100,000) | 60 g |
| Polymer 2: Copolymer of styrene/acrylic acid (65/35) (weight average molecular weight: 10,000) *(copolymer composition ratio: molar ratio) | 140 g |
| Polymer 3: Polyester resin (trade name: VYLON 220, produced by Toyobo Co., Ltd.) | 0.5 g |
| Plasticizer: Compound prepared by dehydrated-condensate of bisphenol A by two equivalents of octaethylene glycol monomethacrylate (trade name: BPE-500, produced by Shin-Nakamura Chemical Co., Ltd.) | 45 g |
| Fluorine-based surfactant (trade name: MEGAFAC F176PF, produced by Dainippon Ink and Chemicals, Incorporated) | 1 g |
| n-Propyl alcohol | 500 g |

The above components were mixed to prepare a coating liquid for the thermoplastic resin layer.

The coating liquid for thermoplastic resin layer was coated on the front surface of the temporary support and then dried at 100° C. for 2 minutes to form a thermoplastic resin layer having a thickness of 10 µm.

(3) Formulation of Coating Liquid for Interlayer

| | |
|---|---:|
| Polyvinyl alcohol (trade name: PVA205, produced by Kuraray Co., Ltd., saponification value: 80%) | 30 g |
| Polyvinylpyrrolidone (trade name: PVP-K90, produced by GAF Corporation) | 3 g |
| Polyurethane (trade name: HYDRAN WLS-202, produced by Dainippon Ink and Chemicals, Incorporated (an aqueous dispersion having solids content of 35%)) | 30 g |
| Distilled water | 487 g |

The above components were mixed to prepare a coating liquid for the interlayer.

The coating liquid for the interlayer was applied on the thermoplastic resin layer which was provided on the temporary support and then dried at 100° C. for 2 minutes to form the interlayer having a thickness of 1.8 µm.

(4) Preparation of Coating Liquid for Photosensitive Resin Layer

On the temporary support having disposed thereon the thermoplastic resin layer and the interlayer were applied coating liquids for red-, blue- and green-sensitive resin layers having the formulations shown in Table 1 and further another coating liquid for a black-sensitive resin layer having the formulation also shown below, followed by drying at 100° C. for 2 minutes. The red-, blue- and green-sensitive resin layers had a thickness after dried of 2.3 µm, and the black-sensitive resin layer had a thickness after dried of 1.6 µm.

TABLE 1

| | Red (g) | Green (g) | Blue (g) |
|---|---|---|---|
| Benzyl methacrylate/methacrylic acid copolymer molar ratio: 73/27, molecular weight: 30,000) | 60 | 33.5 | 34.1 |
| Pentaerythritol hexaacrylate | 28.4 | 25.2 | 32.3 |
| Fluorine-based surfactant (trade name: MEGAFAC F177P, produced by Dainippon Ink and Chemicals, Incorporated) | 0.37 | 0.19 | 0.3 |
| 2,4-Bis(trichloromethyl)-6-[4-(N,N-diethoxycarbonyl)methyl]-8-triazine | 1.31 | 0 | 1.52 |
| 2-Trichloromethyl-5-(p-styrylstyryl)- | 0 | 1.2 | 0 |

TABLE 1-continued

| | Red (g) | Green (g) | Blue (g) |
|---|---|---|---|
| 1,3,4-oxadiazole | | | |
| Phenothiazine | 0.02 | 0.02 | 0.026 |
| Cromophthal Red A 2B (Red) | 27 | 0 | 0 |
| Paliotol Yellow L 1820 | 10.3 | 23 | 0 |
| Heliogen Blue L 6700F (Blue) | 0 | 0 | 25.6 |
| Monastral Green (Green) | 0 | 23 | 0 |
| Methoxypropylene glycol acetate | 310 | 310 | 310 |
| Methyl ethyl ketone | 460 | 460 | 460 |

(5) Composition of Coating Liquid for Light-shielding Black-sensitive Resin Layer

| | |
|---|---:|
| Benzyl methacrylate/methacrylic acid copolymer (molar ratio: 70/30, acid value: 104 mg-KOH/g, weight average molecular weight: 30,000) | 21.0 g |
| 2-Ethylhexyl acrylate/methacrylic acid/methyl methacrylate/benzyl methacrylate copolymer (molar ratio: 7/15/73/5, acid value: 77 mg-KOH/g, weight average molecular weight: 80,000) | 14.7 g |
| Dipentaerythritol hexaacrylate | 26.8 g |
| 2,4-Bis(trichloro)-6-[4-(N,N-diethoxycarbomethyl)-3 bromophenyl]-s-triazine | 1.32 g |
| Carbon black | 27.0 g |
| Pigment Blue 15:6 | 5.70 g |
| Pigment Violet 23 | 3.57 g |
| Hydroquinone monomethyl ether | 0.02 g |
| F117P (trade name, a surfactant produced by Dainippon Ink and Chemicals, Incorporated) | 0.09 g |
| Propylene glycol monomethyl ether acetate | 400 g |
| Methyl ethyl ketone | 600 g |

(6) Formation of Photosensitive Transfer Material

A polypropylene sheet having a thickness of 15 µm was superimposed with each of the obtained photosensitive resin layers of the red, blue, green and black samples and adhered to each other at room temperature under pressure, to prepare photosensitive transfer materials having four colors.

(Evaluation of Surface Resistivity)

A sample from which a cover film had been peeled off was laminated on a glass substrate having a thickness of 1.1 mm using a laminator under a pressure of 10 kg/cm² at a temperature of 130° C. After kept under the moistening conditions in an atmosphere of 25° C. and 30% RH for 24 hours, peeling was conducted on the sample between the temporary support and the thermoplastic resin layer. Onto the front surface of the temporary support of the sample were pressed electrodes of stainless steel sheets 10 cm long and 1 mm wide, aligned at a distance of 1 cm therebetween, under a pressure of 2 kg, and a direct current voltage of 100 V was applied to the sample. A surface resistivity log SR (in terms of logarithmic value) was calculated from a current value i one minute after the application of the voltage according to the following equation.

$$\log SR = 100/(i \times 0.1 \times 0.1)$$

With respect to the surface of the peeled thermoplastic resin layer, a log SR was also obtained in the same manner. Incidentally, the measurement was conducted in an atmosphere of 25° C. and 30% RH. The results are shown in Table 2.

(Evaluation of Amount of Electrostatic Charge on Polyethylene Terephthalate)

A sample from which a cover film had been peeled off was laminated on a glass substrate having a thickness of 1.1 mm using a laminator under a pressure of 10 kg/cm² at a temperature of 130° C. After kept under moistening conditions in an atmosphere of 25° C. and 30% RH for 24 hours, peeling was conducted on the sample between the temporary support and the thermoplastic resin layer. Onto the front surface of the peeled temporary support was pressed a polyethylene terephthalate disc (thickness: 100 μm) having a diameter of 1 cm at a force of 2 kg for one second, and then an electric charge of the polyethylene terephthalate disc was measured by means of a Faraday's gauge. The measured value was defined as q, from which was calculated an amount of electrostatic charge Q of the temporary support according to the following equation.

$$Q = -qx/(0.5 \times 0.5 \times 3.14)$$

With respect to the surface of the peeled thermoplastic resin layer, an amount of electrostatic charge Q was obtained in the same manner. Incidentally, the polyethylene terephthalate disc was subjected to sufficient static elimination before the measurement. Further, the measurement was carried out in an atmosphere of 25° C. and 30% RH. The results are shown in Table 2.

(Evaluation of Surface Potential)

A sample from which a cover film had been peeled off was laminated on a glass substrate having a thickness of 1.1 mm using a laminator under a pressure of 10 kg/cm² at a temperature of 130° C. After kept under moistening conditions in an atmosphere of 25° C. and 30% RH for 24 hours, peeling was conducted on the sample between the temporary support and the thermoplastic resin layer. A surface potential of the peeled temporary support was measured using a surface potentiometer (trade name: SK-030 MODEL, produced by Keyence Corporation). Incidentally, the measurement was carried out one minute after the peeling. With respect to the surface of the peeled thermoplastic resin layer, a surface potential was obtained in the same manner. The results are shown in Table 2.

Example 1

The same procedure was employed as in Comparative Example, except that a charge controlling layer was provided by applying a coating liquid having the following formulation on an entire surface (front surface) of a biaxially oriented polyethylene terephthalate support having a thickness of 75 μm. The results are shown in Table 2.

(1) Temporary Support

A coating liquid having the following formulation was coated on an entire surface (front surface) of the polyethylene terephthalate support so as to give a dry thickness of 0.15 μm and then dried at 180° C. for one minute, to thereby form a charge controlling layer on the support.

[Formulation for Charge Controlling Layer]

| | |
|---|---|
| Binder: (trade name: CHEMIPEARL S-120, a polyolefin-based emulsion (solids content: 27%) produced by Mitsui Petrochemical Industries, Ltd.) | 3 g |
| Colloidal silica (trade name: SNOWTEX C, 20%, produced by Nissan Chemical Industries, Ltd.) | 2 g |
| Epoxy compound (trade name: DENACOL EX-614B, produced by Nagase Chemicals Ltd.) | 0.1 g |
| Gelatin | 0.15 g |
| Distilled water | 94.7 g |

Example 2

The same procedure was employed as in Comparative Example, except that the following temporary support was used and the formulation for the interlayer was changed to that described below. The results are shown in Table 2.

(1) Temporary Support

A coating liquid having the following formulation was applied on an entire surface (back surface) of a polyethylene terephthalate support so as to give a dry thickness of 0.15 μm and then dried at 180° C. for one minute, to thereby provide an electrically conductive layer (a layer for electo-conductivity impartment) on the support.

[Formulation for Electrically Conductive Layer]

| | |
|---|---|
| Binder: (trade name: JURYMER ET410, an acrylic-based emulsion (solids content: 20%) produced by Nihon Junyaku Co., Ltd.) | 15.5 g |
| Electrically conductive tin oxide-antimony oxide fine particles as described in Example 1 of JP-A No. 8-36239 (aqueous dispersion having solids content of 30%) | 16 g |
| Polyoxyethylene phenyl ether | 0.1 g |
| Epoxy compound (trade name: DENACOL EX-614B, produced by Nagase Chemicals Ltd.) | 0.3 g |
| Distilled water | 68.1 g |

Next, a coating liquid having the following formulation was applied on the electrically conductive layer and dried at 180° C. for one minute, to thereby provide a back protective layer having a dry thickness of 0.04 μm.

[Formulation for Back Protective Layer]

| | |
|---|---|
| Binder: (trade name: CHEMIPEARL S-120, a polyolefin-based emulsion (solids content: 27%) produced by Mitsui Petrochemical Industries, Ltd.) | 3 g |
| Colloidal silica (trade name: SNOWTEX C, 20%, produced by Nissan Chemical Industries, Ltd.) | 2 g |
| Epoxy compound (trade name: DENACOL EX-614B, produced by Nagase Chemicals Ltd.) | 0.1 g |
| Distilled water | 94.9 g |

The temporary support was prepared as stated above.

(2) Formulation of Coating Liquid for Interlayer

The same procedure was conducted as in Example 1, except that the following formulation was used for the interlayer. The results are shown in Table 2.

| | |
|---|---|
| Polyvinyl alcohol (trade name: PVA205, produced by Kuraray Co., Ltd., saponification value: 80%) | 30 g |
| Polyvinylpyrrolidone (trade name: PVP-K90, produced by GAF Corporation) | 3 g |
| Polyurethane (trade name: HYDRAN WLS-202, produced by Dainippon Ink and Chemicals, Incorporated (an aqueous dispersion having solids content of 35%)) | 80 g |
| Electrically conductive agent (trade name: AQUA PASS 5%, polyaniline sulfonic acid, produced by Mitsubishi Rayon Co., Ltd.) | 174 g |
| Distilled water | 308 g |
| Methanol | 450 g |

Example 3

The same procedure was repeated as in Example 2, except that the following formulation was used for the interlayer. The results are shown in Table 2.

(1) Interlayer

| | |
|---|---|
| Polyvinyl alcohol (trade name: PVA205, produced by Kuraray Co., Ltd., saponification value: 80%) | 30 g |
| Polyvinylpyrrolidone (trade name: PVP-K90, produced by GAF Corporation) | 3 g |
| Polyurethane (trade name: HYDRAN WLS-202, 35%, produced by Dainippon Ink and Chemicals, Incorporated) | 30 g |
| Electrically conductive agent (trade name: PL-206, 34%, polyvinylbenzyl trimethylammonium chloride, produced by Toho Chemical Industry co., Ltd.) | 26 g |
| Distilled water | 461 g |
| Methanol | 450 g |

The above components were mixed to prepare a coating liquid for the interlayer.

Example 4

The same procedure was employed as in Example 2, except that the following formulation was used for the interlayer. The results are shown in Table 2.

(1) Interlayer

| | |
|---|---|
| Polyvinyl alcohol (trade name: PVA205, produced by Kuraray Co., Ltd., saponification value: 80%) | 30 g |
| Polyvinylpyrrolidone (trade name: PVP-K90, produced by GAF Corporation) | 3 g |
| Polyurethane (trade name: HYDRAN WLS-202, 35%, produced by Dainippon Ink and Chemicals, Incorporated) | 30 g |
| Electrically conductive agent (electrically conductive tin oxide-antimony oxide fine particles as described in Example 1 of JP-A No. 8-36239 (an aqueous dispersion having solids content of 30%)) | 100 g |
| Distilled water | 387 g |
| Methanol | 450 g |

The above components were mixed to prepare a coating liquid for the interlayer.

Example 5

The same procedure was repeated as in Example 2, except that the temporary support of Example 1 was used as the temporary support. The results are shown in Table 2.

Example 6

The same procedure was employed as in Example 2, except that the following temporary support was used. The results are shown in Table 2.

(1) Temporary Support

The electrically conductive layer of Example 2 was provided by coating on an entire surface (front surface) of a biaxially oriented polyethylene terephthalate support having a thickness of 75 $\mu$m. In addition, the charge controlling layer of Example 1 was further provided thereon to thus prepare a temporary support.

TABLE 2

| | Charge Controlling Layer | Electro-Conductivity Impartment (temporary support side) | Electro-Conductivity Impartment (adjacent layer side) | Surface Resistivity (temporary support side) (log $\Omega$) | Surface Resistivity (adjacent layer side) (log $\Omega$) | Difference in Amount of Electrostatic Charge (nC) | Surface Potential (temporary support side) (kV) | Surface Potential (adjacent layer side) (kV) |
|---|---|---|---|---|---|---|---|---|
| Comparative Example | No | No | No | 14.8 | 14.1 | 0.63 | 26.1 | 25.8 |
| Example 1 | Yes | No | No | 14.3 | 14.1 | 0.21 | 0.8 | 0.6 |
| Example 2 | No | Yes (back surface) | Yes | 13.1 | 13.5 | 0.11 | 0.9 | 0.8 |
| Example 3 | No | Yes (back surface) | Yes | 13.1 | 13.4 | 0.09 | 0.5 | 0.5 |
| Example 4 | No | Yes (back surface) | Yes | 13.1 | 13.4 | 0.11 | 1.1 | 0.9 |
| Example 5 | Yes | Yes (back surface) | Yes | 13.1 | 13.5 | 0.02 | 0.2 | 0.2 |
| Example 6 | Yes | Yes (front surface) | Yes | 13.3 | 13.3 | 0.04 | 0.2 | 0.2 |

As is clear from Table 2, in Examples 1 to 6, the surface potentials of both the temporary support side and the adjacent layer side after peeled are decreased as compared with those in Comparative Example. Accordingly, in case where print wiring substrates are produced or color filters are prepared using the photosensitive transfer material according to the invention, when the temporary support is peeled after the lamination step, the temporary support and a surface of a layer from which the temporary support has been peeled are not suffered from electrostatic charge caused by peeling, dust is not attracted by static electricity, and hence thin-film transistors are not broken. Thus, it is possible to stably produce print wiring substrates or prepare color filters even at a high speed.

In accordance with the invention, when peeling is conducted on the temporary support after the lamination step, the temporary support, a surface of a layer from which the temporary support has been peeled off or a peeled adjacent layer achieve a considerably reduced surface potential absolute value, whereby electrostatic charge built-up due to peeling does not occur. Accordingly, in case where print wiring substrates are produced or color filters are prepared even at a high speed, the peeled temporary support and a surface of a layer from which the temporary support has been peeled off do not attract dust by static electricity, and thin-film transistors are not broken, thus making it possible to stably produce print wiring substrates or prepare color filters.

What is claimed is:
1. A photosensitive transfer material comprising a temporary support having disposed thereon an alkali-soluble photosensitive resin layer containing a colorant, wherein when the temporary support is peeled from an adjacent layer provided between the temporary support and the photosensitive resin layer at a peeling rate of 1 m/min in an atmosphere of 25° C. and 30% RH, each of the temporary support and the adjacent layer has a surface potential whose absolute value is 5 kV or less after being peeled.

2. The photosensitive transfer material according to claim 1, wherein each of the temporary support and the adjacent layer has a surface potential whose absolute value is 1 kV or less after being peeled.

3. A photosensitive transfer material comprising a temporary support having disposed thereon an alkali-soluble photosensitive resin layer containing a colorant, wherein when the temporary support is peeled from an adjacent layer provided between the temporary support and the photosensitive resin layer at a peeling rate of 1 m/min in an atmosphere of 25° C. and 30% RH, each of the temporary support and the adjacent layer has a surface resistivity at 25° C. and 30% RH, of $1 \times 10^{14} \Omega/\square$ or less after being peeled.

4. The photosensitive transfer material according to claim 1, wherein a difference between an amount of electrostatic charge on a front surface of the peeled temporary support when it is brought into contact with polyethylene terephthalate, and an amount of electrostatic charge on a surface of the peeled adjacent layer when it is brought into contact with polyethylene terephthalate is 0.5 nC/cm$^2$ or less.

5. The photosensitive transfer material according to claim 3, wherein a difference between an amount of electrostatic charge on a front surface of the peeled temporary support when it is brought into contact with polyethylene terephthalate and an amount of electrostatic charge on a surface of the peeled adjacent layer when it is brought into contact with polyethylene terephthalate is 0.5 nC/cm$^2$ or less.

6. A photosensitive transfer material comprising a temporary support having successively disposed thereon a thermoplastic resin layer, an alkali-soluble interlayer and an alkali-soluble photosensitive resin layer containing a colorant, wherein when the temporary support is peeled from the thermoplastic resin layer at a peeling rate of 1 m/min in an atmosphere of 25° C. and 30% RH, each of the temporary support and an adjacent layer provided between the temporary support and the photosensitive resin layer has a surface potential whose absolute value is 5 kV or less after being peeled.

7. The photosensitive transfer material according to claim 6, wherein the thermoplastic resin layer contains a substance capable of altering a tribo series rank of the layer.

8. The photosensitive transfer material according to claim 7, wherein the substance capable of altering a tribo series rank of the layer is gelatin.

9. The photosensitive transfer material according to claim 1, wherein the temporary support includes a charge controlling layer.

10. The photosensitive transfer material according to claim 9, wherein the charge controlling layer contains gelatin.

11. The photosensitive transfer material according to claim 1, further comprising an electrically conductive layer.

12. The photosensitive transfer material according to claim 6, further comprising an electrically conductive layer.

13. The photosensitive transfer material according to claim 12, wherein the electrically conductive layer is provided at at least one of between the thermoplastic resin layer and the interlayer, and between the interlayer and the photosensitive resin layer.

14. The photosensitive transfer material according to claim 11, wherein the electrically conductive layer contains at least one of an organic electrically conductive substance and an inorganic electrically conductive substance.

15. The photosensitive transfer material according to claim 12, wherein the electrically conductive layer contains at least one of an organic electrically conductive substance and an inorganic electrically conductive substance.

16. The photosensitive transfer material according to claim 14, wherein the organic electrically conductive substance is selected from the group consisting of polyacrylic acid, polyethylene oxide, polypyrrole and polyaniline.

17. The photosensitive transfer material according to claim 15, wherein the organic electrically conductive substance is selected from the group consisting of polyacrylic acid, polyethylene oxide, polypyrrole and polyaniline.

18. The photosensitive transfer material according to claim 14, wherein the inorganic electrically conductive substance is selected from the group consisting of carbon, metal fine powders and metal oxide fine powders.

19. The photosensitive transfer material according to claim 15, wherein the inorganic electrically conductive substance is selected from the group consisting of carbon, metal fine powders and metal oxide fine powders.

20. The photosensitive transfer material according to claim 6, wherein the thermoplastic resin layer contains a resin selected from the group consisting of acrylic resins, polystyrene resins, polyesters, polyurethanes, rubber-based resins, vinyl acetate-based resins, polyolefin-based resins, and copolymers thereof.

* * * * *